United States Patent [19]
Crean

[11] 4,224,523
[45] Sep. 23, 1980

[54] ELECTROSTATIC LENS FOR INK JETS

[75] Inventor: Peter A. Crean, Penfield, N.Y.

[73] Assignee: Xerox Corporation, Stamford, Conn.

[21] Appl. No.: 970,305

[22] Filed: Dec. 18, 1978

[51] Int. Cl.[3] .......... H01J 37/12

[52] U.S. Cl. .......... 250/396 R; 250/398; 346/75

[58] Field of Search .......... 250/396 R, 398, 492 B; 313/359, 361, 432; 346/75, 1

[56] References Cited

U.S. PATENT DOCUMENTS

| | | | |
|---|---|---|---|
| 2,345,080 | 5/1944 | Ardenne | 250/398 |
| 2,452,919 | 11/1948 | Gabor | 250/396 |
| 2,600,129 | 6/1952 | Richards | 346/75 |
| 3,373,437 | 3/1968 | Sweet et al. | 346/75 |
| 3,596,275 | 7/1971 | Sweet | 346/75 |
| 3,877,036 | 4/1975 | Loeffler et al. | 346/75 |
| 4,123,760 | 10/1978 | Hou | 346/75 |
| 4,126,781 | 11/1978 | Siegel | 250/396 R |

*Primary Examiner*—Bruce C. Anderson
*Attorney, Agent, or Firm*—Michael H. Shanahan

[57] ABSTRACT

An ink jet printer is disclosed employing a row of multiple ink jet nozzles aimed at a moving target or copy sheet. Each nozzle has a separate charging electrode associated with it but all the nozzles share a pair of common deflection plates that divert charged droplets over a shared gutter toward the target. Uncharged droplets go into the gutter. An electrostatic lens is shared by all the nozzles being positioned in the path of the charged droplets deflected toward the target. The lens aligns or focuses charged droplets from all the nozzles to a focus line on the target despite misalignment of nozzles relative to a print line on the target.

21 Claims, 5 Drawing Figures

ELECTROSTATIC LENS FOR INK JETS

BACKGROUND OF THE INVENTION

This invention relates to ink jet printers. More specifically, this invention relates to a novel component for ink jet printers herein called an electrostatic lens for aligning or changing the trajectories of charged droplets emitted at high velocities from a nozzle.

The trajectory of charged ink droplets are difficult to align because the droplets are small, typically from 1 to 25 mils in diameter, and consequently the nozzle orifices are small and difficult to manufacture and assemble. A coarse alignment must be achieved to align the trajectory or droplets emitted by a nozzle with a charging tunnel and a pair of closely spaced deflection plates. The charging tunnel diameter is normally only about from 3 to 10 times the droplet diameter whereas considerable larger spacing separates the deflection plates. Once a coarse alignment is obtained, a vernier or fine alignment is often desired yet difficult to achieve.

The alignment difficulty is compounded in multiple jet printers. For example, in a multi-jet printer as disclosed in U.S. Pat. No. 3,373,437 to Sweet and Cumming, the trajectories of the multiple jets must be aligned relative to each other so as to print a straight row of droplets to match a line of print or pixel positions on a target. Heretofore, electrical techniques have been used to correct for the misalignment of one trajectory relative to another. The target is moved at a constant velocity past the print line. The electrical command to place a droplet at a given pixel position is delayed (or accelerated) a small amount to allow the target to move a distance corresponding to the misalignment of the jet trajectory for that pixel position. Alternately, the charge on the errant droplet is increased (or decreased) to vary its deflection and hence placement on the target. Clearly, the alignment is achieved at the expense of increased complexity to the electrical control circuits for the printer.

SUMMARY

Accordingly, it is a primary object of my invention to overcome the alignment problem of prior art, charged ink droplet systems.

Another object of this invention is to devise an electrostatic lens for focusing charged droplets following different trajectories to a common point or line.

A specific object of this invention is to build a cylindrical electrostatic lens, analogous to an optical half-cylinder glass lens, that focuses generally parallel, charged ink droplet streams to a line (rather than a point). The axis of a cylindrical electrostatic lens is a plane that intersects the focal line and along which moving charged droplets are not diverted by the lens.

The foregoing and other objects of my invention are achieved by establishing a focusing electric field along the intended trajectory of a droplet. The focusing field extends in a direction generally parallel to the trajectory of a droplet in contrast to the generally normal direction of the electric field created by conventional deflection plates. The focusing field is preferably given symmetry at least on two sides of a droplet's trajectory thereby allowing properly aligned droplets to traverse the focusing field without having a course correction imparted to it.

The cylindrical lens effect is achieved with four linear electrodes. At an upstream position, an electrode is placed equidistant above and below the intended droplet trajectory. At a downstream position, the remaining two electrodes are placed equidistant above and below the intended droplet trajectory. The four electrodes are substantially parallel and orthogonal to the trajectory. A potential difference coupled between the upstream and downstream fields creates two electric fields whose boundaries resemble two half cylinders abutting at a tangent plane parallel to their bases. The tangent plane defines a path over which a charged droplet is not deflected. Droplets that enter the field above or below the tangent plane are focused to a line on that plane a determinable distance downstream. The focal line is constant for droplets having substantially the same velocities and mass to charge ratios.

THE PRIOR ART

The Sweet U.S. Pat. No. 3,596,275 having an effective filing date of July 31, 1963, describes the prior art high velocity ink jet device for which the instant invention is especially suited. Therein, a fluid ink is forced from a volume through a small nozzle under high pressure. The natural tendency of the resultant stream emitted from the nozzle to break up into droplets is promoted by accoustically stimulating the ink at a frequency of about 120 kilohertz. The droplets tend to form at regular intervals and at a constant site. The ink is conductive. As the droplets separate from the fluid column emitted from the nozzle, the droplets pass a charging electrode, often a closed tunnel, where charge is induced on it by a voltage coupled to the charging electrode.

The charged droplet is propelled along a trajectory toward a target that is moving at right angles to its flight. Before the droplet reaches the target it passes between parallel plates. A steady state electric field normal to the path of the droplet is created by a 2000–4000 volt potential difference coupled between the deflection plates. The amount of charge on the droplet determines the amount of deflection imparted to it by the deflection field.

There is no teaching in this basic Sweet patent of the use of electric fields that extend generally in the direction of the droplet trajectory. As such, the Sweet patent is understandably silent on the present concept of focusing.

The Sweet and Cumming U.S. Pat. No. 3,373,437 mentioned above describes a binary ink jet system in which two deflection plates are shared by a plurality of linearly aligned nozzles. The binary feature is that the droplet from a given nozzle either is charged and deflected toward a pixel position on the target or remains uncharged and is collected in a gutter. The charge on the droplets sent to the paper is intended to be equal. Here as above, there is no suggestion of a focusing field of any kind.

The Loeffler et al U.S. Pat. No. 3,877,036 discloses an ink jet alignment electrode. The electrode, however, is positioned to act on the fluid column at a location prior to droplet formation. Also, the deflecting field is generally normal to the fluid column and does not include a path through the field that will not bend a properly aligned column as with the present focusing fields.

THE DRAWINGS

Other objects and features of my invention will be apparent from the specification and the drawings considered alone and together. The drawings are:

Figure 5:
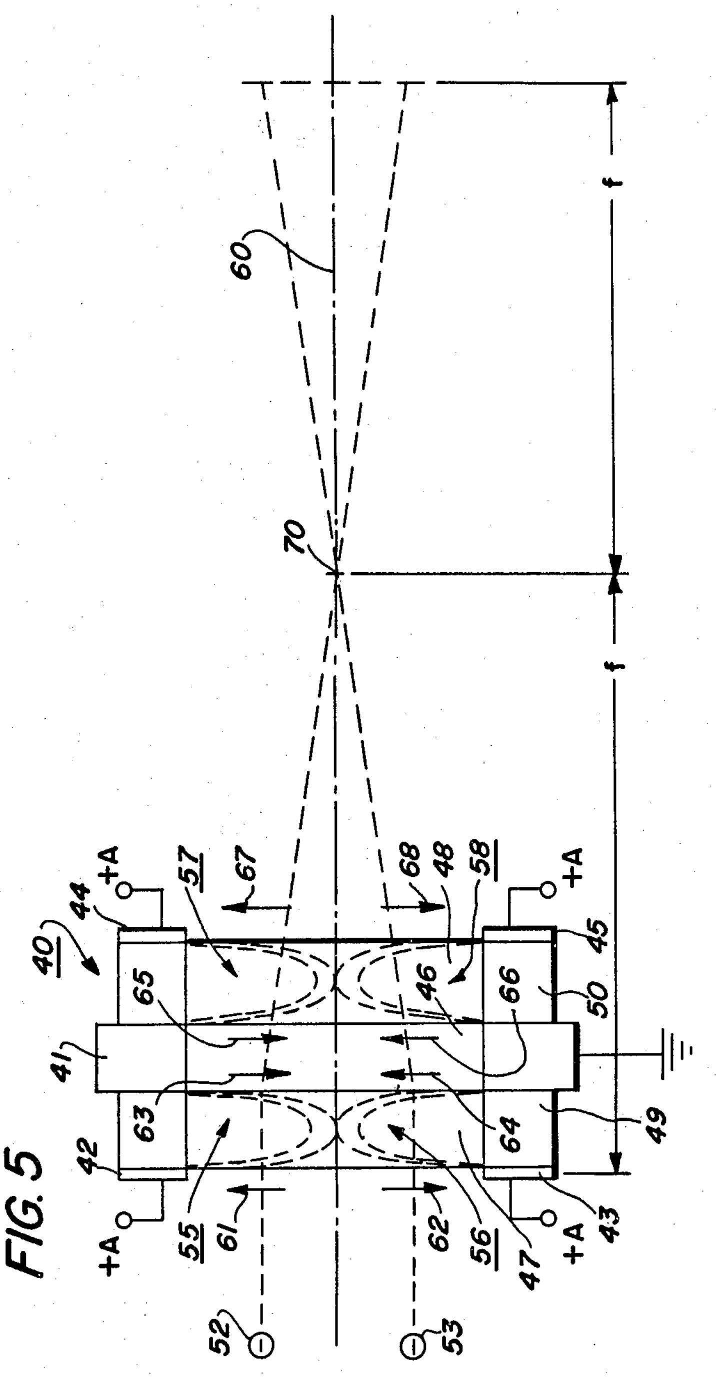

FIG. 5 is a cross-section, elevation view of another embodiment of an electrostatic lens. The lens in this figure employs an intermediate electrode between upstream and downstream electrodes. The lens employs two focusing fields and has a focal distance generally as depicted.

DETAILED DESCRIPTION

Herein, the ink jet system described is of the Sweet type disclosed in the above named U.S. Pat. No. 3,596,275 and that disclosure is hereby expressly incorporated by reference. Briefly, a transducer modulates or stimulates ink in a chamber or tube coupled to a nozzle. The ink is subjected to pressures of from about 20 to 150 psi. The modulation of the ink causes a stream of discrete droplets of like velocity, mass, shape and trajectory to be emitted from the nozzle. The modulating apparatus and circuitry is not shown to simplify and thereby clarify the present discussion. For details on that apparatus, the reader is referred to the above Sweet patent.

Figure 1:
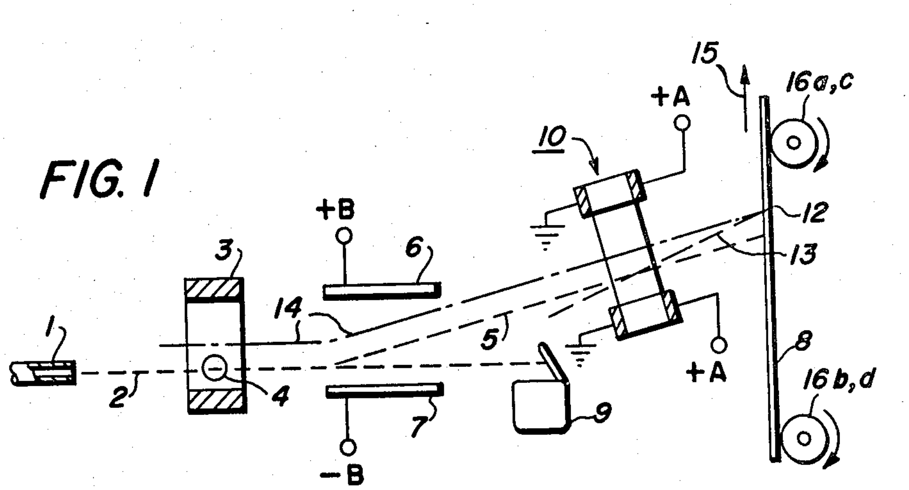
FIG. 1 is a side view in cross-section of a multi-nozzle ink jet printer employing a cylindrical electrostatic lens according to the present invention.
Figure 2:
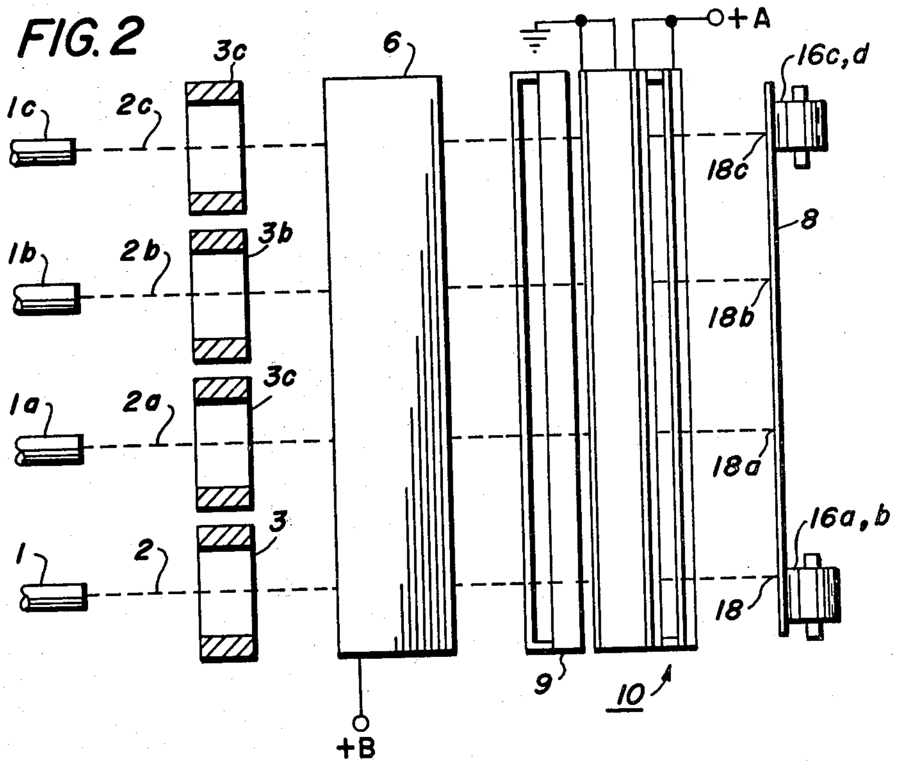
FIG. 2 is a plan view of a multi-nozzle ink jet printer of FIG. 1.

FIGS. 1 and 2 are a side view and plan view of a multiple nozzle ink jet printer. Like elements in the various figures have the same reference numbers. The printer includes the nozzle 1 that emits a stream of droplets along a trajectory indicated by dashed line 2. The droplets are charged at charging electrode 3 as indicated by the circle 4 having the minus sign indicating a net negative charge. For the polarities given, the negatively charged droplets are deflected upwardly along the path indicated by dashed line 5 by the deflection plates 6 and 7. The deflected droplets head toward the target 8 and the uncharged, low charged, or oppositely charged droplets are collected by the gutter 9. The cylindrical, electrostatic lens 10 focuses the charged droplets to a common focal line 12 on the target. The droplet 4 is diverted over the path indicated by the dashed line 13 by the lens. The dashed line 14 (actually a plane) is the centerline or axis of lens 10. Charged droplets that travel through the lens along the centerline do not have their trajectories altered.

The lens 10 can also be located upstream of the deflection plates. Specifically, lens 10 can be positioned between the charging electrodes 3 and the deflection plates 6 and 7.

The printer of FIGS. 1 and 2 is a binary printer similar to that disclosed in the Sweet and Cumming U.S. Pat. No. 3,373,437 mentioned at the outset. The disclosure of that patent is incorporated herein by reference. Printing is achieved by moving the target 8 at generally right angles to the ink jet path or trajectory 2. The target is moved at a constant velocity in the upward direction in FIG. 1 as indicated by arrow 15. Four drive rollers 16*a, b, c* and *d* are coupled to an appropriate drive source (not shown) to advance the target.

Referring to FIG. 2, a plurality of nozzles 1 through 1*c* are representative of the multiple nozzles of a printer. For good quality image reproduction, a printer should have about 100 nozzles per inch. This means that to cover an 8.5 inch standard paper width, 850 nozzles are deployed as illustrated in FIG. 2. The packing density is reduced if the nozzles are aligned in two or more rows with one row offset one nozzle or pixel position from the other. The lens 10 is appropriate for the multiple row arrangement of nozzles provided allowance is made for one row to be focused to a different line than the other. In addition, the offset between rows can be made large enough to accommodate a lens for each row.

In FIG. 2, each nozzle 1–1*c* has a separate charging electrode 3—3*c* that charges droplets traveling the generally parallel paths 2–2*c*. The object is to place a droplet—when called for by a video signal—at adjacent pixel positions 18–18*c* on the target. The scan line of 18–18*c* pixels should be straight. However, any misalignment of the nozzles or any error in the amount of charge placed on a droplet by the charging electrodes causes the droplet to miss the pixel location. The result is a distortion of an image constructed from a raster pattern of multiple pixel lines.

Heretofore, the alignment of the nozzles to the pixel locations has included electrical techniques. For example, should nozzle 1*a* tend to place its droplets slightly above pixel position 18*a* on the target, the video signal applied to electrode 3*a* is delayed, relative to nozzles 1, 1*b* and 1*c*, a short duration to allow the target to move the amount of the offset. Alternately, the amount of change induced on the droplet is increased or decreased to vary the deflection an amount to correctly place a droplet at a given pixel position. The delay or magnitude change are applied to subsequent droplets.

The present invention uses lens 10 for the alignment of droplets. In FIG. 2, the lens 10 is seen in plan view as shared by all the nozzles.

Figure 3:
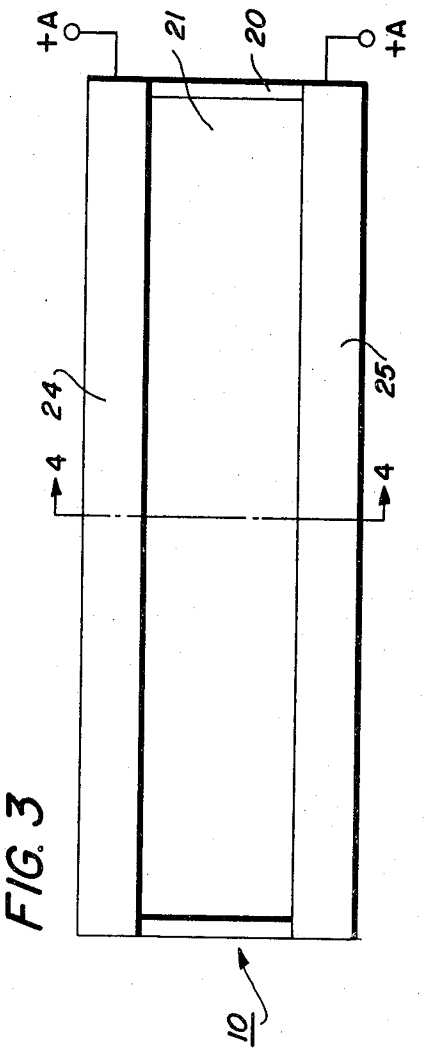
FIG. 3 is a view of the cylindrical electrostatic lens in FIGS. 1 and 2 looking upstream from the target toward the nozzles.
Figure 4:
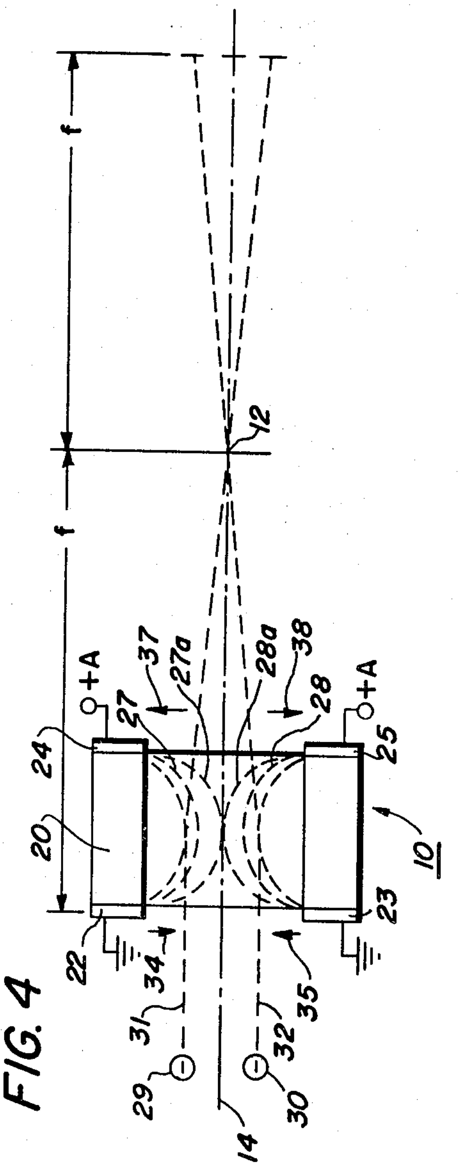
FIG. 4 is a cross-section, elevation view of the lens along lines 4—4 in FIG. 3. Also, this figure illustrates the focusing field and the focal distance for the lens.

Referring to FIGS. 3 and 4, lens 10 is made up of an insulating member 20 having a rectangular tunnel or hole 21 for passage of droplets. The upstream face of the insulator 20 has rectangular electrodes 22 and 23 at the long sides of the rectangular entrance to the tunnel 21. The upstream electrodes 22 and 23 are coupled to ground potential, by way of example. The downstream face of insulator 20 has rectangular electrodes 24 and 25 at the long sides of the rectangular exit to the tunnel 21. The downstream electrodes are coupled to a high positive voltage indicated by the +A symbol. As an example, the insulator 20 is a phenolic insulator board of the type used for printed circuit boards and the electrodes 22–25 are copper strips formed by conventional evaporation and chemical etching techniques. The +A voltage is preferably about 1500 volts for a 60 mil thick board 20. The length of the tunnel 21 is about 61 mils, i.e. the conductors are about 0.5 mils in thickness.

Briefly referring to FIG. 1, the lens 10 establishes a field that focuses droplets to a line 12 that corresponds to the scan line of pixels 18–18*c*. The focusing field is better described in connection with FIG. 4. The focusing electric field is represented by the dashed lines 27 and 28 emanating from the edges of the upstream and downstream electrodes 22–25 and confined substantially within the region defined by the semi-circles 27*a* and 28*a* along the length of the electrodes. The envelope of the field lines is analogous to two half-cylinders abutting at a tangent plane parallel to their bases. The abutting tangent plane is normal to the drawing and is conveniently defined by centerline 14.

The plane defined by centerline 14 is a path through the focusing field comprising fields 27 and 28 over which a charged droplet remains unaffected. However, a droplet such as the negatively charged droplet 29 that is on a trajectory 31 offset from the centerline is focused to the focal line 12 by the focusing field. Likewise, the droplet 30 below the centerline 14 is focused to the focal line 12. All other droplets traveling trajectories lying above, below or between the paths 31 and 32 are also focused to line 12.

The focusing fields 27 and 28 extend in the direction of droplet travel from the upstream electrodes 22 and 23 to the downstream electrodes 24 and 25. At the entrance to the tunnel 21, the focusing fields include a high density flux region that has vertical force components of significant magnitude. These forces are represented by the vectors 34 and 35. In the center region of the fields 27 and 28, the field and force vectors are parallel to the centerline 14 and have the same direction as the droplet for the polarities shown. These parallel forces accelerate the charged droplets shown. As a result, the charged droplets are under the influence of the focusing forces 34 and 35 longer than they are corresponding defocusing forces at the tunnel exit represented by vectors 37 and 38. When the +A potential is coupled to the upstream electrodes 22 and 23 and the ground potential is coupled to the downstream electrodes 24 and 25, the charged droplets are decelerated as they enter the tunnel 21. In this case, the charged droplets once again are under the influence of the focusing forces for a longer time than the defocusing forces. With this reversed polarity, the defocusing forces are at the entrance to the lens 10 and the focusing forces are at the exit to the lens. Similarly, a positively charged droplet will be focused by the field shown in FIG. 4 by first being decelerated and then accelerated. The focusing forces always predominate over the defocusing forces regardless of the relative polarities.

Experimentation shows that the focusing forces represented by the vectors 34 and 35 are not offset by the effects of the defocusing forces represented by the vectors 37 and 38. In otherwords, despite what appears to be equal and opposite forces, the focusing forces represented by vector 34 prevail over forces represented by vector 37 and bend the trajectory 31 of a droplet 30 so as to intersect the centerline 14 at the focal line 12. This is because the time spent in the region of the focusing fields is greater than the time spent in the regions of the defocusing fields. Similarly, the trajectory 32 of a droplet 29 below the centerline 14, is bent by the focusing forces represented by vector 35 to intersect the focus point despite the defocusing forces represented by vector 38.

The symbol f in FIG. 4 is representative of the focal length of the lens. For convenience it is measured from the entrance to tunnel 21 to the empirically determinable focus line 12. As mentioned earlier, the focus f varies for a change in the focusing field potential. When +A is descreased, f is increased and when +A is increased, f is decreased. Also, when the amount of charge on droplets 29 and 30 are increased, f is decreased and when the amount of charge on the droplets is decreased, f is increased.

FIG. 3 shows the lens 10 looking from the target upstream toward the nozzles 1–1*c*. The insulator board 20 is shown with the conductive copper everywhere but along the narrow rectangular sides of the exit to tunnel 21. Since electrodes 24 and 25 (as well as electrodes 22 and 23) are coupled to the same potential, the two electrodes could be electrically coupled by copper deposited on the vertical, exposed areas of the board 20. The vertical, conductive shape should be spaced a significant distance from the end nozzles 1 and 1*c* so the distortion to the cylindrically shaped fields 27 and 28 are minimized.

FIG. 5 illustrates another embodiment of the instant invention employing multiple, cylindrical focusing fields. The lens 40 is similar in construction to lens 10 but includes an intermediate electrode 41 between upstream electrodes 42 and 43 and downstream electrodes 44 and 45. Electrode 41 is a metal plate having a rectangular hole or tunnel 46 in it that matches the rectangular tunnels 47 and 48 in insulators 49 and 50 abutted against member 41. The intermediate electrode 41 is fabricated from 63 mil thick aluminum sheet and the insulators 49 and 50 from 60 mil phenolic board. The upstream and downstream electrodes 42–45 are on the parallel, long edges of the tunnel orifices as in the case of the electrodes 22–25 on lens 10. The height of the tunnels 46–48 is about 50 mils for droplets of about 1 to 10 mils in diameter.

Upstream and downstream electrodes 42–45 are all coupled to a high voltage (represented by the symbol +A) of about +1500 volts, for example, and the intermediate electrode is grounded. Alternately, the intermediate electrode 41 can be coupled to +1500 volts, for example, and the upstream and downstream electrodes 42–45 to ground.

There are two focusing fields associated with lens 40 including the upstream field made up of the upper and lower cylindrical fields 55 and 56 and the downstream field made up of the upper and lower cylindrical fields 57 and 58. The centerline 60 defines the path over which the trajectory of a charged droplet is not bent. For the polarities shown, the upstream field extends in a direction opposite to the flight of the droplet, and the downstream field extends in the same direction of the flight of the droplet. The defocusing forces represented by vectors 61 and 62 at the entrance to lens 40 and vectors 67 and 68 at the exit to the lens are found not to prevent the focusing of offset charged droplets 52 and 53 at the focal line 70. The focusing forces represented by the vectors 63–66 are predominant because of the greater time spent in the focusing region. That is, the acceleration and deceleration of the droplets always act to favor focusing rather than defocusing. The opposing polarity of the fields of lens 40 are selected so that no net accelerating or decelerating energy is given to the droplets passing through it. In contrast, the single field lens, e.g. lens 10, imparts a very small amount of accelerating or decelerating energy to a charged droplet. The amount of net energy change is negligible yet, surprisingly, the focusing effect is realized.

The focal distance f is measured, for convenience, from the edge of the upstream edge of the intermediate electrode 41 to the focal line 70.

The function of lens 40 was tested by directing a stream of droplets through the lens and charging every third droplet. The uncharged droplets, by definition, are not effected by an electric field but they establish a base line for measurements. A lens was constructed like lens 40 above. About +1500 volts was coupled to the intermediate electrode 41. A ground potential was coupled to the upstream and downstream electrodes 42–45. Every third droplet emitted by a nozzle 1 was charged negatively by synchronously coupling about +650 volts to a charging tunnel 3. The uncharged droplet trajectory was about 10 mils offset from the centerline of the lens. The charged droplets were focused at about 1.2 inches downstream from the lens.

The foregoing described lenses are novel components for ink jet applications. The focusing fields associated with lens 10 and 40 operate on charged droplets analogously to a half-cylinder, glass lens that focuses light rays entering its flat base to a line in space parallel to the base. Other focusing field shapes including portions parallel to the droplet trajectories can be devised that are analogous to spherical and other optical lenses. Modifications of that type are within the scope of this invention.

What is claimed is:

1. A cylindrical electrostatic lens for changing the trajectories of charged fluid droplets among a plurality of generally parallel streams of continuously generated discrete droplets of about the same size and velocity when the trajectories of the droplets are above or below a center plane through the lens comprising upstream and downstream electrodes including means for coupling to a voltage source for establishing upper and lower focusing fields between the electrodes in the paths of a plurality of parallel droplet streams, the upper and lower fields having a center plane therethrough over which the trajectories of charged drops are not changed and focusing charged droplets following trajectories above and below the center plane and intersecting a rectangle normal to the center plane to a focal line on the center plane.

2. The lens of claim 1 further including an electrical insulating member having a tunnel therethrough for the passage of droplets with said upstream and downstream electrodes positioned adjacent the upstream and downstream faces of the insulating member near the boundaries of the tunnel.

3. The lens of claim 2 wherein said tunnel is generally rectangularly shaped in cross-section and the upstream electrodes are adjacent two of the four boundaries of the upstream tunnel entrance and the downstream electrodes are adjacent two of the four boundaries of the downstream tunnel exit.

4. The lens of claim 3 wherein the upstream and downstream electrodes are adjacent parallel boundaries of the rectangular tunnel.

5. A cylindrical electrostatic lens for focusing to a focal line on a center plane through the lens discrete charged droplets having substantially the same velocities and mass to charge ratios but following a plurality of substantially parallel trajectories comprising upstream and downstream electrodes positioned at upstream and downstream locations relative to a plurality of parallel droplet trajectories and including means for coupling to a voltage source to create a potential difference between the electrodes oriented in the direction of the parallel droplet trajectories, the electrodes having shapes to create upper and lower electric focusing fields defining a center plane through the lens over which trajectories of charged droplets are not changed and acting on trajectories of charged droplets above or below the center plane and intersecting a rectangle normal to the center plane to focus droplets to a print line on the center plane.

6. The lens of claim 5 wherein the polarity of the focusing field is defined by a vector having a direction substantially the same as the velocity of a charged droplet.

7. The lens of claim 5 wherein the polarity of the focusing field is defined by a vector having a direction substantially opposite to that of the velocity of a charged droplet.

8. An ink jet printer comprising a plurality of ink jet nozzles in a row for emitting continuous streams of discrete droplets of substantially the same mass and velocity along generally parallel trajectories toward a target, charging means associated with each nozzle for charging slected droplets emitted from the nozzles and a cylindrical electrostatic lens having means for coupling to a voltage source for establishing upper and lower focusing electric fields in the paths of the plurality of parallel droplet trajectories emitted from the nozzles for defining a center plane between them over which the trajectory of a charged drop is not changed and for focusing charged droplets following trajectories above or below the center plane and intersecting a rectangle normal to the center plane to a focal line on the center plane near a target to be printed.

9. The printer of claim 8 wherein the lens includes at least four parallel conductive members with two members positioned above and below the plurality of droplet trajectories emitted from the nozzles at an upstream location and with two members positioned above and below the plurality of trajectories at a downstream position with the upper focusing field formed between the upstream and downstream members above the center plane and the lower focusing field formed between the upstream and downstream members below the center plane.

10. The printer of claim 8 wherein the upper and lower fields include field lines that are substantially semi-circles with the center plane parallel to a tangent plane to both the upper and lower semi-circles and parallel to the bases of the semi-circles.

11. The printer of claim 8 further including deflection means located between either the lens and the target or the charging means and the lens adjacent the trajectories of the droplets from the plurality of nozzles for establishing a deflection electric field generally normal to the trajectories of the droplets for deflecting charged droplets.

12. The printer of claim 11 further including gutter means positioned between the charging means and a target for collecting droplets not intended for a target.

13. The printer of claim 8 wherein the cylindrical lens includes two upstream electrodes positioned on opposite sides of the droplet trajectories and having means for coupling to a first voltage and two downstream electrodes positioned on opposite sides of the droplet trajectories and having means for coupling to a second voltage.

14. The printer of claim 13 wherein the first voltage is positive relative to the second voltage and droplets are charged positively by the charging means.

15. The printer of claim 14 wherein the first voltage is negative relative to the second voltage and droplets are charged positively by the charging means.

16. The printer of claim 13 wherein the first voltage is positive relative to the second voltage and the droplets are charged negatively by the charging means.

17. The printer of claim 13 wherein the first voltage if negative relative to the second voltage and the droplets are charged negatively by the charging means.

18. The printer of claim 13 wherein some droplets are charged positively and some droplets are charged negatively by the charging means.

19. The apparatus of claim 8 wherein said charging means includes conductive tunnel members associated with each nozzle for charging droplets passing through the tunnel.

20. The printer of claim 13 wherein the nozzles emit droplets of velocities greater than 400 inches per second.

21. The printer of claim 13 wherein the potential difference between the first and second voltages is at least 1000 volts.

* * * * *